(12) United States Patent
Babayan et al.

(10) Patent No.: US 11,262,662 B2
(45) Date of Patent: *Mar. 1, 2022

(54) POST EXPOSURE PROCESSING APPARATUS

(71) Applicant: Applied Materials, Inc., Santa Clara, CA (US)

(72) Inventors: Viachslav Babayan, Sunnyvale, CA (US); Ludovic Godet, Sunnyvale, CA (US); Kyle M. Hanson, Kalispell, MT (US); Robert B. Moore, Bigfork, MT (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/062,326

(22) Filed: Oct. 2, 2020

(65) Prior Publication Data

US 2021/0026257 A1 Jan. 28, 2021

Related U.S. Application Data

(60) Division of application No. 16/548,711, filed on Aug. 22, 2019, now Pat. No. 10,845,715, which is a
(Continued)

(51) Int. Cl.
*G03F 7/20* (2006.01)
*G03F 7/38* (2006.01)
*H01L 21/67* (2006.01)

(52) U.S. Cl.
CPC ............ *G03F 7/70716* (2013.01); *G03F 7/38* (2013.01); *G03F 7/70725* (2013.01);
(Continued)

(58) Field of Classification Search
CPC ............ G03F 7/70076; G03F 7/70725; H01L 21/67028; H01L 21/67051;
(Continued)

(56) References Cited

U.S. PATENT DOCUMENTS 6,079,358 A 6/2000 Kim et al.
6,187,152 B1 2/2001 Ting et al.
(Continued)

FOREIGN PATENT DOCUMENTS

CN 102244023 A 11/2011
JP 2003-124088 A 4/2003
(Continued)

OTHER PUBLICATIONS

Written Opinion for PCT/US2017/059969 dated Feb. 9, 2018.
(Continued)

*Primary Examiner* — Hung Nguyen
(74) *Attorney, Agent, or Firm* — Patterson + Sheridan, LLP (57) ABSTRACT

Implementations described herein relate to a platform apparatus for post exposure processing. In one implementation, a platform apparatus includes a plumbing module and a process module. The process module further includes a central region having a robot disposed therein, and a plurality of process stations disposed about the central region and sharing the plumbing module. Each process station includes a process chamber and a post process chamber in a stacked arrangement. The process chamber includes a chamber body defining a process volume, a door coupled to the chamber body, a first electrode coupled to the door, and a power source communicatively coupled to the first electrode.

19 Claims, 7 Drawing Sheets

Related U.S. Application Data continuation of application No. 15/947,409, filed on Apr. 6, 2018, now Pat. No. 10,401,742, which is a continuation of application No. 15/435,007, filed on Feb. 16, 2017, now Pat. No. 9,964,863.

(60) Provisional application No. 62/436,873, filed on Dec. 20, 2016.

(52) U.S. Cl.
CPC .... *H01L 21/6719* (2013.01); *H01L 21/67028* (2013.01); *H01L 21/67051* (2013.01); *H01L 21/67109* (2013.01); *H01L 21/67126* (2013.01); *H01L 21/67167* (2013.01); *H01L 21/67178* (2013.01); *H01L 21/67248* (2013.01)

(58) Field of Classification Search
CPC ......... H01L 21/67109; H01L 21/67178; H01L 21/67248; H01L 21/67126; H01L 21/67167
USPC ...................................... 355/27, 30
See application file for complete search history.

(56) References Cited

U.S. PATENT DOCUMENTS

| | | | |
|---|---|---|---|
| 6,242,164 | B1 | 6/2001 | Choi et al. |
| 6,686,132 | B2 | 2/2004 | Cheng et al. |
| 6,841,342 | B2 | 1/2005 | Nishi et al. |
| 7,187,796 | B1 | 3/2007 | Phan et al. |
| 7,274,429 | B2 | 9/2007 | Paxton et al. |
| 7,474,377 | B2 | 1/2009 | Matsuoka et al. |
| 7,780,366 | B2 | 8/2010 | Ogata et al. |
| 7,780,813 | B2 | 8/2010 | Pau et al. |
| 9,280,070 | B2 | 3/2016 | Xie et al. |
| 9,964,863 | B1 | 5/2018 | Babayan et al. |
| 10,203,604 | B2 | 2/2019 | Babayan et al. |
| 10,401,742 | B2 * | 9/2019 | Babayan ............. H01L 21/6719 |
| 2002/0096114 | A1 | 7/2002 | Carducci et al. |
| 2002/0123011 | A1 | 9/2002 | Kawano et al. |
| 2004/0001787 | A1 | 1/2004 | Porshnev et al. |
| 2004/0016637 | A1 | 1/2004 | Yang et al. |
| 2005/0074706 | A1 | 4/2005 | Bristol et al. |
| 2006/0130751 | A1 | 6/2006 | Volfovski et al. |
| 2006/0177586 | A1 | 8/2006 | Ishida et al. |
| 2006/0201616 | A1 | 9/2006 | Matsuoka et al. |
| 2007/0077171 | A1 | 4/2007 | Hamada |
| 2007/0144439 | A1 | 6/2007 | Englhardt et al. |
| 2007/0177870 | A1 | 8/2007 | Hamada |
| 2008/0050679 | A1 | 2/2008 | Salek et al. |
| 2008/0304940 | A1 | 12/2008 | Auer-Jongepier et al. |
| 2009/0002722 | A1 | 1/2009 | Hayasaki et al. |
| 2010/0009274 | A1 | 1/2010 | Yamamoto |
| 2010/0248152 | A1 | 9/2010 | Scheer et al. |
| 2011/0165515 | A1 | 7/2011 | Wang et al. |
| 2011/0290283 | A1 | 12/2011 | Obweger et al. |
| 2012/0031894 | A1 | 2/2012 | Shigetomi |
| 2012/0244645 | A1 | 9/2012 | Rathsack et al. |
| 2012/0285621 | A1 | 11/2012 | Tan |
| 2012/0312336 | A1 | 12/2012 | Itoh et al. |
| 2015/0218697 | A1 | 8/2015 | Nguyen et al. |
| 2016/0357107 | A1 | 12/2016 | Buchberger, Jr. et al. |
| 2018/0004094 | A1 | 1/2018 | Hanson et al. |

FOREIGN PATENT DOCUMENTS

| | | |
|---|---|---|
| TW | 201523712 A | 6/2015 |
| TW | 201546948 A | 12/2015 |
| TW | 201615905 A | 5/2016 |
| WO | 2010/054076 A2 | 5/2010 |
| WO | 2011/112823 A2 | 9/2011 |
| WO | 2016/190887 A1 | 12/2016 |
| WO | 2018-004815 A1 | 1/2018 |

OTHER PUBLICATIONS

Office Action for Taiwan Application No. 106140879 dated Nov. 13, 2019.

Communication pursuant to Rule 164(1) EPC and Search Report for European Application No. 17885260.4 dated Jun. 16, 2020.

Extended European Search Report for European Application No. EP 17 88 5260 dated Aug. 27, 2020.

Office Action for Taiwan Application No. 106140879 dated Jun. 30, 2020.

Search Report for Taiwan Application No. 106140879 dated Jun. 30, 2020.

Office Action for Korean Application No. 10-2019-7021280 dated Oct. 14, 2020.

\* cited by examiner

POST EXPOSURE PROCESSING APPARATUS

CROSS-REFERENCE TO RELATED APPLICATIONS

This application is a divisional of U.S. patent application Ser. No. 16/548,711, filed Aug. 22, 2019, which is a continuation of U.S. patent application Ser. No. 15/947,409, filed Apr. 6, 2018, which is a continuation of U.S. patent application Ser. No. 15/435,007, filed Feb. 16, 2017, which claims benefit of U.S. Provisional Patent Application No. 62/436,873, filed Dec. 20, 2016, all of which are herein incorporated by reference in their entirety.

BACKGROUND

Field

Implementations of the present disclosure generally relate to apparatus for processing substrates after lithographic exposure.

Description of the Related Art

Integrated circuits have evolved into complex devices that can include millions of components (e.g., transistors, capacitors and resistors) on a single chip. Photolithography is a process that may be used to form components on a chip. Generally the process of photolithography involves a few basic stages. Initially, a photoresist layer is formed on a substrate. A chemically amplified photoresist may include a resist resin and a photoacid generator. The photoacid generator, upon exposure to electromagnetic radiation in the subsequent exposure stage, alters the solubility of the photoresist in the development process. The electromagnetic radiation may have any suitable wavelength, for example, a 193 nm ArF laser, an electron beam, an ion beam, or other suitable source.

In an exposure stage, a photomask or reticle may be used to selectively expose certain regions of the substrate to electromagnetic radiation. Other exposure methods may be maskless exposure methods. Exposure to light may decompose the photo acid generator, which generates acid and results in a latent acid image in the resist resin. After exposure, the substrate may be heated in a post-exposure bake process. During the post-exposure bake process, the acid generated by the photoacid generator reacts with the resist resin, changing the solubility of the resist during the subsequent development process.

After the post-exposure bake, the substrate, particularly the photoresist layer, may be developed and rinsed. Depending on the type of photoresist used, regions of the substrate that were exposed to electromagnetic radiation may either be resistant to removal or more prone to removal. After development and rinsing, the pattern of the mask is transferred to the substrate using a wet or dry etch process.

In a recent development, an electrode assembly is utilized to generate an electric field to a photoresist layer disposed on the substrate prior to or after an exposure process so as to modify chemical properties of a portion of the photoresist layer where the electromagnetic radiation is transmitted to for improving lithography exposure/development resolution. However, the challenges in implementing such systems have not yet been adequately overcome.

Therefore, there is a need for apparatus for improving post exposure bake and development processes.

SUMMARY

In one implementation, a platform apparatus is provided. The apparatus includes a factory interface, a plumbing module, and a process module disposed between the factory interface and the plumbing module. The process module includes a central region having a robot disposed therein and a plurality of process stations disposed about the central region. Each process station includes a process chamber and a post process chamber in a stacked arrangement.

In another implementation, a platform apparatus is provided. The apparatus includes a factory interface, a plumbing module, and a process module disposed between the factory interface and the plumbing module. The process module includes a central region having a robot disposed therein. The robot includes a plurality of end effectors and the end effectors are moveable in three axes. A plurality of process stations are disposed about the central region and each process station includes a process chamber and a post process chamber in a stacked arrangement.

In yet another implementation, a platform apparatus is provided. The apparatus includes a factory interface and an intermediate module disposed adjacent the factory interface. A buffer station is disposed in the intermediate module and a support module is disposed adjacent the intermediate module. A plurality of cleaning stations are disposed in the support module and a process module is disposed adjacent to the support module. The process module includes a plurality of process stations and each process station includes a process chamber and a post process chamber in a stacked arrangement and a plumbing module dedicated to each process station.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, may admit to other equally effective implementations.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Implementations described herein relate to apparatus for post exposure processing. More specifically, implementations described herein relate to field-guided post exposure process chambers and cool down/development chambers implemented on process platforms. In one implementation, a plurality of post exposure process chamber and cool/down development chamber pairs are positioned on a process platform in a stacked arrangement and utilize a shared plumbing module. In another implementation, a plurality of post exposure process chamber and cool down/development chambers are positioned on a process platform in a linear arrangement and each of the chambers utilize an individually dedicated plumbing module.

Figure 1:
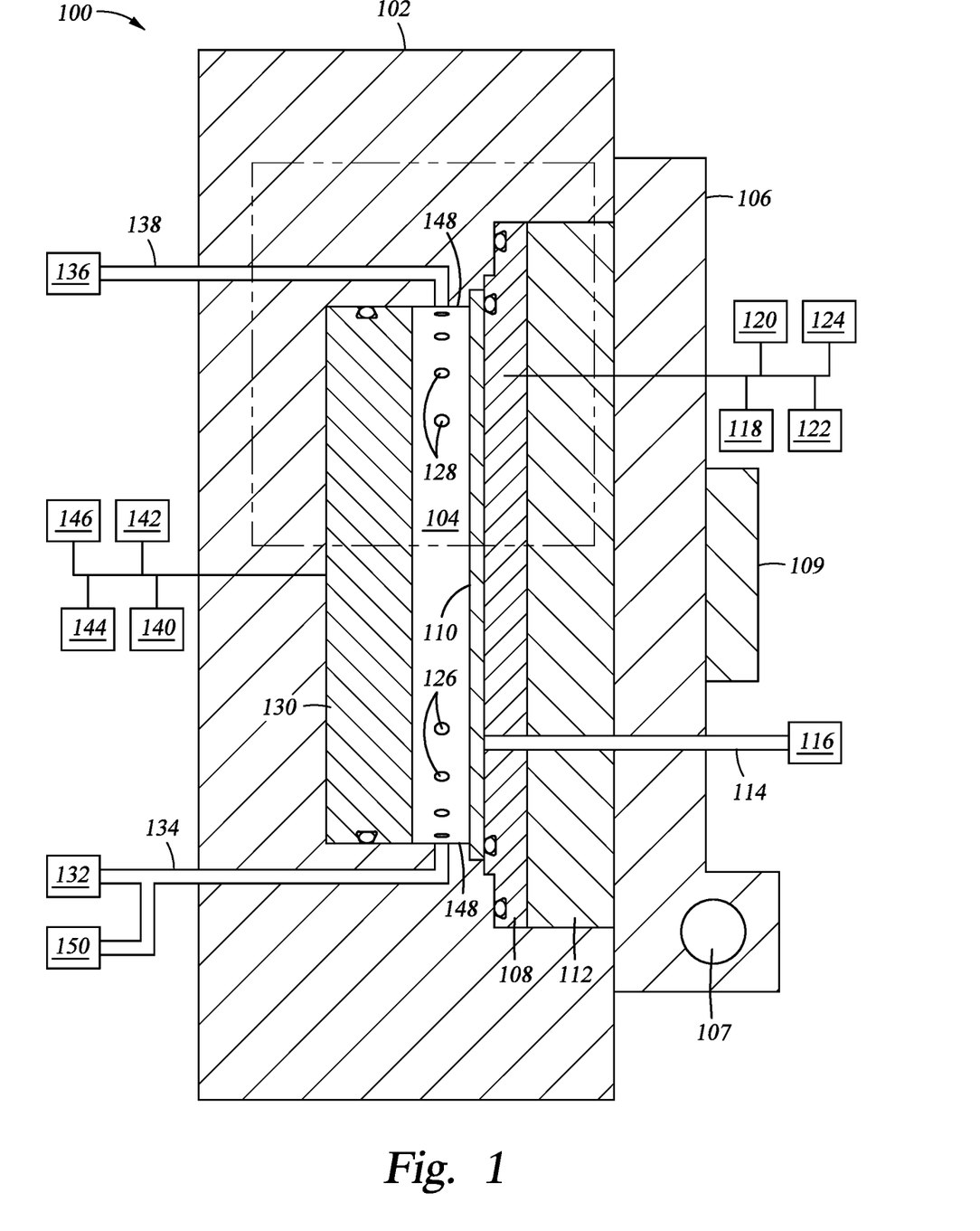
FIG. 1 illustrates a schematic, cross-sectional view of a process chamber according to implementations described herein.

FIG. 1 illustrates a schematic, cross-sectional view of a process chamber 100 according to implementations described herein. In one implementation, the process chamber 100 is configured for performing immersion field guided post exposure bake (iFGPEB) processes. The chamber 100 is positioned in a vertical orientation such that when a substrate is being processed, a major axis of the substrate is oriented vertically and a minor axis of the substrate is oriented horizontally. The chamber 100 includes a chamber body 102, which is manufactured from a metallic material, such as aluminum, stainless steel, and alloys and combinations thereof. Alternatively, the chamber body 102 is manufactured from polymer materials, such as polytetrafluoroethylene (PTFE), or high temperature plastics, such as polyether ether ketone (PEEK).

The body 102 defines, at least partially, a process volume 104 therein. For example, a sidewall 148 of the body 102 defines a diameter of the process volume 104. A major axis of the process volume 104 is oriented vertically and a minor axis of the process volume 104 is oriented horizontally. A first plurality of fluid ports 126 are formed in the chamber body 102 through the sidewall 148. A second plurality of fluid ports 128 are also formed in the sidewall 148 of the chamber body 102 opposite the first plurality of fluid ports 126. The first plurality of fluid ports 126 are in fluid communication with a process fluid source 132 via first conduit 134. The second plurality of fluid ports 128 are in fluid communication with a fluid outlet 136 via a second conduit 138. The process fluid source 132, either alone or in combination with other apparatus, is configured to preheat process fluid to a temperature of between about 70° C. and about 130° C., such as about 110° C., prior to the fluid entering the process volume 104.

In one implementation, a purge gas source 150 is also in fluid communication with the process volume 104 via the first fluid conduit 134 and the first plurality of fluid ports 126. Gases provided by the purge gas source 150 may include nitrogen, argon, inert gases and the like to purge the processing volume 104 during or after iFGPEB processing. When desired, purge gases may be exhausted from the processing volume 104 via the fluid outlet 136.

A door 106 is operably coupled to the chamber body 102. In the illustrated implementation, the door 106 is oriented in a processing position such that the door 106 is disposed adjacent to and abuts the chamber body 102. The door 106 is formed from materials similar to the materials selected for the chamber body 102. Alternatively, the chamber body may be formed from a first material, such as a polymeric material, and the door 106 may be formed from a second material different from the first material, such as a metallic material. A shaft 107 extends through the door 106 and provides an axis (i.e. the Z-axis) about which the door 106 rotates to open and close the door 106.

The door 106 may be coupled to a track (not shown) and the door 106 is configured to translate along the track in the X-axis. A motor (not shown) may be coupled to the door 106 and/or the track to facilitate movement of the door 106 along the X-axis. Although the door 106 is illustrated in a closed processing position, opening and closing of the door 106 may be performed by moving the door 106 away from the chamber body 02 along the X-axis prior to rotating the door 106 about the Z-axis. For example, the door 106 may rotate about 90° from the illustrated processing position to a loading position such that positioning of a substrate 110 on a first electrode 108 can be performed with a reduced probability of substrate breakage during loading.

A backing plate 112 is coupled to the door 106 and the first electrode 108 is coupled to the backing plate 112. The backing plate 112 is formed from materials similar to the door 106 or the chamber body 102, depending on the desired implementation. The first electrode 108 may be formed from an electrically conductive metallic material. In addition, the material utilized for the first electrode 108 may be a non-oxidative material. The materials selected for the first electrode 108 provide for desirable current uniformity and low resistance across the surface of the first electrode 108. In certain implementations, the first electrode 108 is a segmented electrode configured to introduce voltage non-uniformities across the surface of the first electrode 108. In this implementation, a plurality of power sources are utilized to power different segments of the first electrode 108.

The first electrode 108 is sized to accommodate attachment of the substrate 110 thereon. The first electrode 108 is also sized to allow for positioning adjacent the chamber body 102 and the process volume 104. In one implementation, the first electrode 108 is fixably coupled to the backing plate 112 and the door 106. In another implementation, the first electrode 108 is rotatably coupled to the backing plate 112 and the door 106. In this implementation, a motor 109 is coupled to the door 106 and is configured to impart rotational movement on either the backing plate 112 or the first electrode 108. In one implementation, the first electrode 108 is configured as a ground electrode.

A vacuum source 116 is in fluid communication with a substrate receiving surface of the first electrode 108. The vacuum source 116 is coupled to a conduit 114 which extends from the vacuum source 116 through the door 106, the backing plate 112, and the first electrode 108. Generally, the vacuum source 116 is configured to vacuum chuck the substrate 110 to the first electrode 108.

A heat source 118, a temperature sensing apparatus 120, a power source 122, and a sensing apparatus 124 are coupled to the first electrode 108. The heat source 118 provides power to one or more heating elements, such as resistive heaters, disposed within the first electrode 108. It is also contemplated that the heat source 118 may provide power to heating elements disposed within the backing plate 112. The heat source 118 is generally configured to heat either the first electrode 108 and/or or the backing plate 112 to facilitate preheating of fluid during iFGPEB processes. The heat source 118 may also be utilized to maintain a desired temperature of the process fluid during substrate processing in addition to or distinct from preheating the process fluid. In one implementation, the heat source 118 is configured to heat the first electrode 108 to a temperature of between about 70° C. and about 130° C., such as about 110° C.

The temperature sensing apparatus 120, such as a thermocouple or the like, is communicatively coupled to the heat source 118 to provide temperature feedback and facilitate heating of the first electrode 108. The power source 122 is configured to supply, for example, between about 1 V and about 20 kV to the first electrode 108. Depending on the type of process fluid utilized, current generated by the power source 122 may be on the order of tens of nano-amps to hundreds of milliamps. In one implementation, the power source 122 is configured to generate electric fields ranging from about 1 kV/m to about 2 MV/m. In some implementations, the power source 122 is configured to operate in either voltage controlled or current controlled modes. In both modes, the power source may output AC, DC, and/or pulsed DC waveforms. Square or sine waves may be utilized if desired. The power source 122 may be configured to provide power at a frequency of between about 0.1 Hz and about 1 MHz, such as about 5 kHz. The duty cycle of the pulsed DC power or AC power may be between about 5% and about 95%, such as between about 20% and about 60%.

The rise and fall time of the pulsed DC power or AC power may be between about 1 ns and about 1000 ns, such as between about 10 ns and about 500 ns. The sensing apparatus 124, such as a voltmeter or the like, is communicatively coupled to the power source 122 to provide electrical feedback and facilitate control of the power applied to the first electrode 108. The sensing apparatus 124 may also be configured to sense a current applied to the first electrode 108 via the power source 122.

A second electrode 130 is coupled to the chamber body 102 adjacent the process volume 104 and partially defined the process volume 104. Similar to the first electrode 108, the second electrode 130 is coupled to a heat source 140, a temperature sensing apparatus 142, a power source 144, and a sensing apparatus 146. The heat source 140, a temperature sensing apparatus 142, a power source 144, and a sensing apparatus 146 may function similarly to the heat source 118, a temperature sensing apparatus 120, a power source 122, and a sensing apparatus 124. In one implementation, the second electrode 130 is an actively powered electrode and the first electrode 108 is a ground electrode. As a result of the aforementioned electrode arrangement, acid generated upon exposure of a resist disposed on the substrate 110 may be modulated during iFGPEB processing to improve patterning and resist de-protection characteristics.

Figure 2:
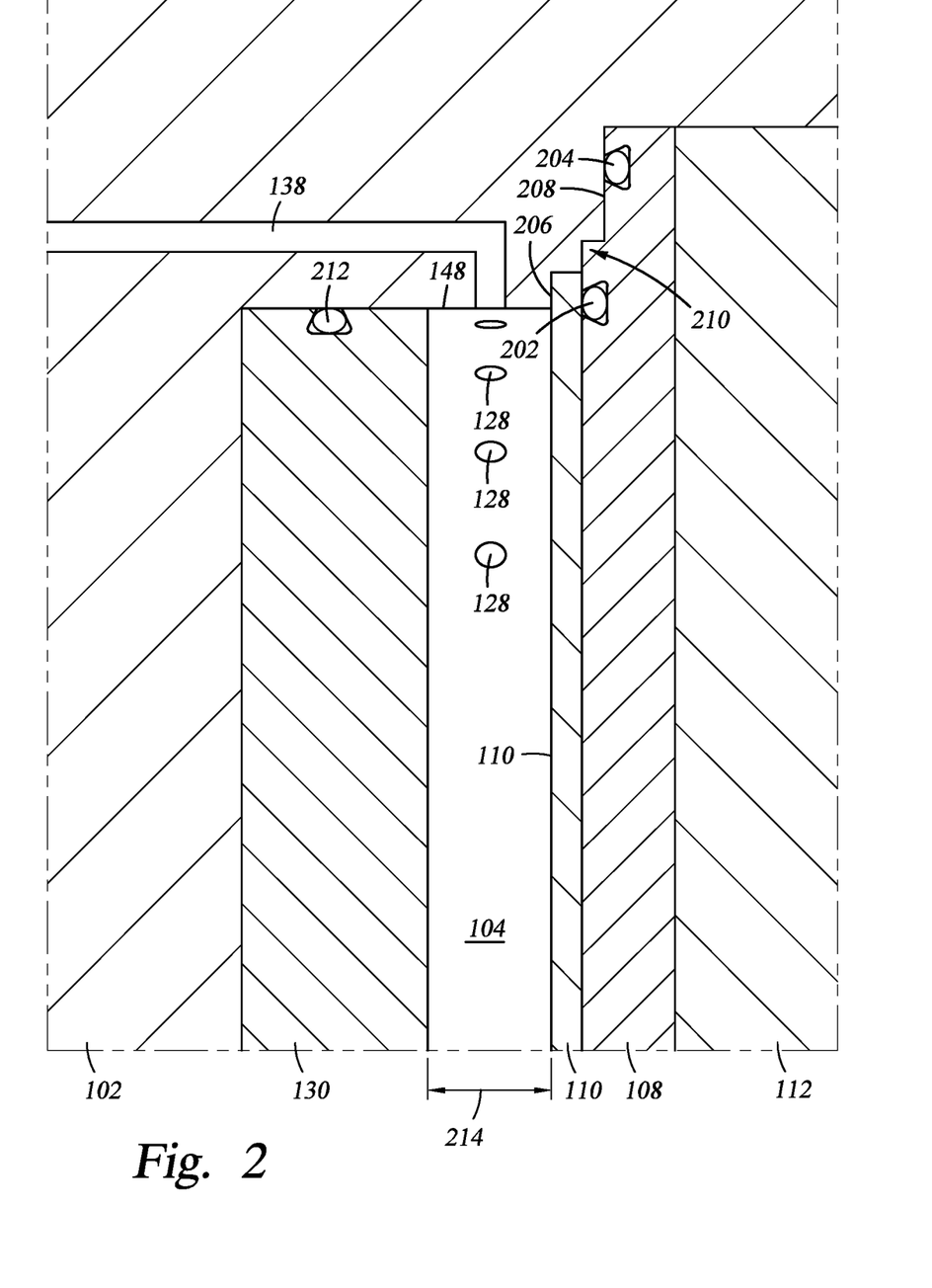
FIG. 2 illustrates a detailed view of a portion of the process chamber of FIG. 1 according to implementations described herein.

FIG. 2 illustrates a detailed view of a portion of the process chamber 100 of FIG. 1 according to implementations described herein. The process volume 104 has a width 214 defined between the substrate 110 and the second electrode 130. In one implementation, the width 214 of the process volume 104 is between about 1.0 mm and about 10 mm, such as between about 4.0 mm and about 4.5 mm. The relatively small gap between the substrate 110 and the second electrode 130 reduces the volume of the process volume 104 which enables utilization of reduced quantities of process fluid during iFGPEB processing. In addition, the width 214, which defines a distance between the second electrode 130 and the substrate, is configured to provide for a substantially uniform electrical field across the surface of the substrate 110. The substantially uniform field provides for improved patterning characteristics as a result of iFG-PEB processing. Another benefit of the gap having the width 214 is a reduction in voltage utilized to generate the desired electrical field.

In operation, the process volume 104 is filled with process fluid during iFGPEB processing. In one implementation, a first flow rate utilized to fill the process volume 104 with process fluid prior to activation of an electric field is between about 5 L/min and about 10 L/min. Once the process volume 104 is filled with process fluid, the electric field is applied and a second flow rate of process fluid between about 0 L/min and about 5 L/min is utilized during iFGPEB processing. In one implementation, the process fluid fill time is between about 1 second and about 5 seconds and the processing time is between about 30 seconds and about 90 seconds, such as about 60 seconds. In one implementation, process fluid continues to flow during iFGPEB processing. In this implementation, the volume of the process volume 104 is exchanged between about 1 time and about 10 times per substrate processed. In another implementation, the process fluid is predominantly static during processing. In this implementation, the volume of the process volume 104 is not exchanged during substrate processing of each substrate.

In another operational implementation, a first flow rate is utilized to initially fill the process volume 104. The first flow rate is less than 5 L/min for an amount of time to fill the process volume 104 such that the first fluid ports 126 are submerged. A second flow rate of greater than 5 L/min is them utilized to fill the remainder of the process volume 104. During application of electric field in iFGPEB processing, a third flow rate of less than 5 L/min is utilized. The flow rate modulation between the first and second flow rates is configured to reduce turbulence of the fluid with in the process volume 104 and reduce or eliminate the formation of bubbles therein. However, if bubbles are formed, the buoyancy of the bubbles enables the bubbles to escape from the process volume 104 via the second fluid ports 128 in order to minimize the insulating effect of the bubbles on the electric field during iFGPEB processing. Accordingly, a more uniform electric field may be achieved to improve iFGPEB processing.

To reduce the probability of process fluid leakage out of the process volume, a plurality of O-rings are utilized to maintain the fluid containment integrity of the process volume. A first O-ring 202 is disposed in the first electrode 108 on the substrate receiving surface of the first electrode 108. The first O-ring 202 may be positioned on the first electrode radially inward from an outer diameter of the substrate 110.

In one example, the first O-ring 202 is positioned on the first electrode 108 a distance between about 1 mm and about 10 mm radially inward from the outer diameter of the substrate 110. The first O-ring is positioned to contact the backside of the substrate 110 when the substrate is chucked to the first electrode 108. A first surface 206 of the sidewall 148 is shaped and sized to contact an edge region of the substrate 110 when the substrate 110 is in the illustrated processing position.

In one implementation, the first O-ring 202 is disposed in the first electrode 108 opposite the first surface 206 of the sidewall 148. It is contemplated that the first O-ring 202 may prevent the leakage of process fluid from the process volume 104 to a region behind the substrate 110, such as the substrate supporting surface of the first electrode 108. Advantageously, vacuum chucking of the substrate 110 is maintained and process fluid is prevented from reaching the vacuum source 116.

The first electrode 108 has a ledge 210 disposed radially outward of the first O-ring. The ledge 210 is disposed radially outward from the position of the first O-ring 202. A second O-ring 204 is coupled to the first electrode 108 radially outward of the ledge 210. A second surface 208 of the sidewall 148 is shaped and sized to contact the first electrode 108 adjacent to and extending radially inward from the outer diameter of the first electrode 108. In one implementation, the second O-ring 204 is disposed in contact with the second surface 208 of the sidewall 148 when the substrate 110 is disposed in a processing position. It is contemplated that the second O-ring 204 may prevent the leakage of process fluid from the process volume 108 beyond the outer diameter of the first electrode 108.

A third O-ring 212 is coupled to the second electrode 130 along an outer diameter of the second electrode 130. The third O-ring 212 is also disposed in contact with the sidewall 148 of the chamber body 102. The third O-ring 212 is configured to prevent process fluid from flowing behind the second electrode 130. Each of the O-rings 202, 204, 212 are formed from an elastomeric material, such as a polymer or the like. In one implementation, the O-rings 202, 204, 212 have a circular cross-section. In another implementation, the O-rings 202, 204, 212 have a non-circular cross-section, such as a triangular cross section or the like. It is also contemplated that each of the O-rings 202, 204, 212 are subjected to a compressive force suitable to prevent the passage of process fluid beyond the O-rings 202, 204, 212 and fluidly seal the process volume 104.

Figure 3:
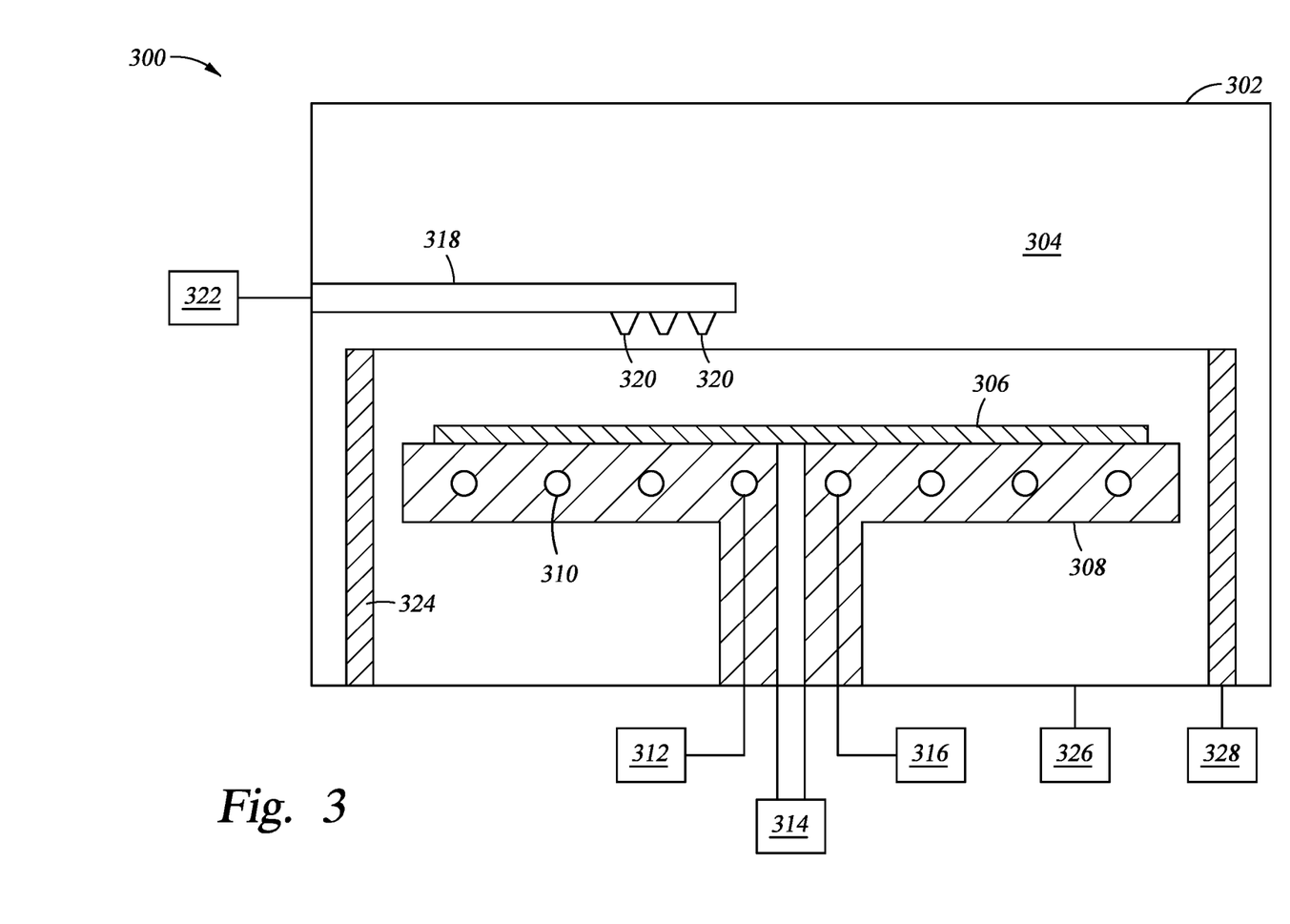
FIG. 3 illustrates a post process chamber according to implementations described herein.

FIG. 3 illustrates a post process chamber 300 according to implementations described herein. After iFGPEB processing of a substrate in the process chamber 100, the substrate is transferred to the post process chamber 300. The post process chamber 300 includes a chamber body 302 defining a process volume 304 and a pedestal 308 disposed in the process volume 304. A substrate 306 positioned on the pedestal 308 is post processed by cooling and rinsing the substrate 306. By combining cooling and rinsing, the bake to cool delay of substrate processing is minimized.

When the substrate 306 is positioned on the pedestal 308, the substrate is vacuum chucked by application of vacuum from a vacuum source 314. Cooling of the substrate 306 begins once the substrate 306 is chucked. Fluid conduits 310 are formed in the pedestal 308 and the fluid conduits 310 are in fluid communication with a cooling fluid source 312. Cooling fluid is flowed through the fluid conduits 310 to cool the substrate 306.

During cooling, the substrate 306 is also rinsed to remove any remaining process fluid still present on the substrate surface. Rinse fluid is dispensed onto the device side of the substrate 306 from a fluid delivery arm 318 which may include fluid delivery nozzles 320. Rinse fluid, such as de-ionized water or the like, is provided from a rinse fluid source 322 via the arm 318 and the nozzles 320.

After rinsing and cooling, the substrate 306 is optionally spin dried by rotating the pedestal 308. The pedestal 308 is coupled to a power source 316 which enables rotation of the pedestal 308. During spin drying of the substrate 306, a shield 324 is raised to collect fluid spun off of the substrate 306. In certain implementations, the shield 324 is also raised during cooling and/or rinsing of the substrate 306. The shield 324 is ring like in shape and sized with an inner diameter greater than a diameter of the pedestal 308. The shield 324 is also disposed radially outward of the pedestal 308. The shield 324 is coupled to a motor 328 which raises and lowers the shield 324 such that the shield 324 extends above the substrate 306. Fluid collected during spin drying by the shield 324 is removed from the process volume 304 via a drain 326. It is noted that during cooling and rinsing of the substrate 306, the shield 324 may optionally be disposed in a lowered position and subsequently raised during spin drying of the substrate 306. The shield 324 may also be lowered during loading and unloading of the substrate 306.

Once the substrate 306 has been dried, resist on the substrate 306 is developed by the application of a developer, such as tetramethylammonium hydroxide (TMAH). In one implementation, the developer is dispensed from the arm 318 and nozzles 320. After development, the substrate 306 is rinsed with deionized water and dried again to prepare the substrate 306 for subsequent processing.

Figure 4:
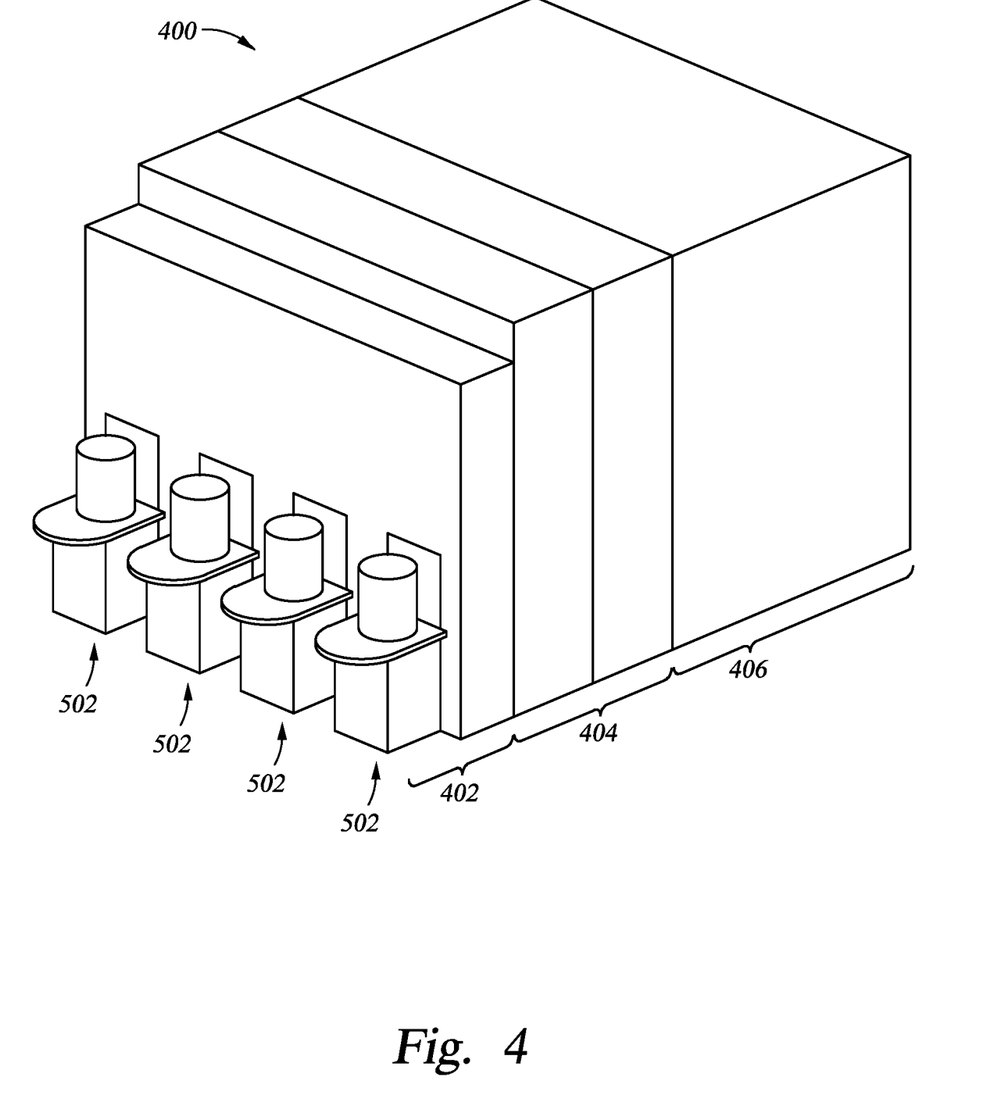
FIG. 4 illustrates a perspective view of a process platform according to implementations described herein.

FIG. 4 illustrates a perspective view of a process platform 400 according to implementations described herein. One example of the process platform 400 is the BLAZER™ platform, available from Applied Materials, Inc., Santa Clara, Calif. It is contemplated that other suitably configured platforms from other manufacturers may also be utilized in accordance with the implementations described herein.

The process platform 400 includes a factory interface 402, a process module 404, and a plumbing module 406. The factory interface 402 is coupled to the process module 404 and the process module 404 is coupled to the plumbing module 406. The factory interface 402 includes a plurality of front opening unified pods (FOUPs) 502, such as four FOUPs 502. However, it is contemplated that the factory interface 402 may utilize a greater or lesser number of FOUPs 502, depending upon the throughput capability of the process module 404.

The process module 404 includes a plurality of process chambers. In one implementation, the process module 404 includes a plurality of process chambers 100 and a plurality of post process chambers 300. It is contemplated that the process module 404 may be implemented with corresponding numbers of process chambers 100 and post process chambers 300. In one example, the process module 404 includes four process chambers 100 and four post process chambers 300. In another example, the process module 404 includes six process chamber s 100 and six post process chambers 300. It is believed that utilizing pairs of process and post process chambers 100, 300 provides for improved process efficiency and increased throughput.

The process module 404 may also include a plurality of cleaning chambers. The cleaning chambers may be utilized in a variety of implementations, for example, pre-cleaning substrates prior to processing in the process chambers 100 or cleaning substrates after processing the post process chambers 300. In an operational implementation, a substrate enters the process platform 400 through one of the FOUPs 502 where the substrate is transferred through the factory interface 402 to the process module 404. The substrate is then processed in one of the process chambers 100 and transferred to a corresponding one of the post process chambers 300. As described above, cleaning of the substrate is optionally performed before or after iFGPEB processing and development in the process module 404. Upon completion of the iFGPEB processing and any desired post process cleaning, the substrate is returned to the factory interface 402 and one of the FOUPs 502.

The plumbing module 406 includes a full complement of apparatus for performing iFGPEB processing utilizing the process chambers 100 and post process chambers 300 disposed in the process module 404. The plumbing module 406 generally includes all fluid handling components for each of the chambers of the process module 404. As such, the plumbing components are disposed in a single location which is easily accessible for maintenance. In addition, the plumbing module 406 enables a single location for supply and return of fluids utilized in iFGPEB processing. The plumbing module 406 may also include in-situ fluid analysis apparatus. For example, the fluids utilized in iFGPEB processing may be analyzed for various aspects, such as temperature via a thermocouple, flow rate via a flow meter, etc. The ability to gather fluid data and other process data in-situ provides for more efficient operation of the platform 400 by enabling real time process parameter modulation.

The plumbing module 406 is configured to share certain components between the process chambers 100 and post process chambers 300 in order to reduce the cost associated with the plumbing apparatus complement. For example, instead of each process chamber 100 having individual plumbing components dedicated to a single process chamber 100, the plumbing module utilized plumbing apparatus which are shared between the plurality of the process chambers 100. Similarly, the post process chambers 300 utilize plumbing apparatus which are shared between the plurality of post process chamber 300.

For operating the process chamber 100, the plumbing module 406 includes a process fluid source reservoir having a volume sufficient to supply process fluid to the process chambers 100 in a sequential manner. For example, the process fluid source reservoir (an associated complement of plumbing components, e.g. flow meters, flow controllers, conduits, heaters, filters, valves, drains, etc.) is configured to continuously provide process fluid in a volume sufficient to operate the process chambers 100 sequentially. In another implementation, the process fluid reservoir and associated plumbing apparatus complement is configured to provide a volume of process fluid sufficient to operate the plurality of process chambers 100 concurrently.

Similarly, for operation of the post process chambers 300, the plumbing module 406 includes at least a rinse fluid source reservoir, a cooling fluid source reservoir, a developer source reservoir and associated plumbing apparatus complement. The post process chambers 300 may be operated sequentially or concurrently and the plumbing apparatus complement and reservoirs are configured to facilitate processing in either implementation by providing sufficient volumes of fluid to enable efficient operation of the post process chambers 300.

Figure 5:
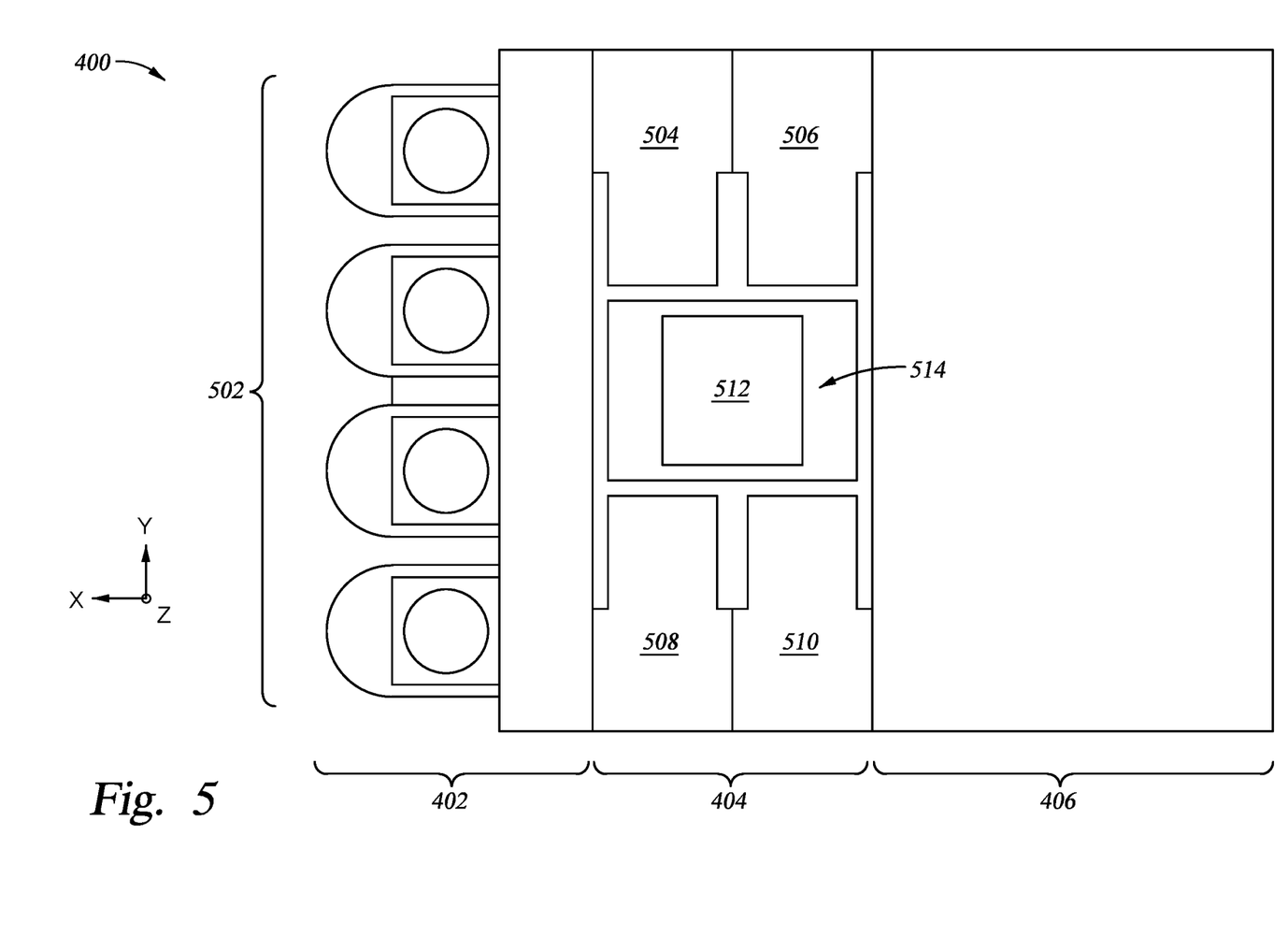
FIG. 5 illustrates a schematic, plan view of the process platform of FIG. 4 according to implementations described herein.

FIG. 5 illustrates a schematic, plan view of the process platform 400 of FIG. 4 according to implementations described herein. The process module 404, which includes the process chambers 100 and post process chambers 300, is configured with pairs of chambers 100 and 300 in process stations 504, 506, 508, 510. While four process stations are illustrated, it is contemplated that a lesser or greater number of process stations, such as six process stations, may be used according to the implementations described herein. The process stations 504, 506, 508, 510 are disposed about a periphery of the process module 404 and a robot 512 is disposed in a central region 514 between the plurality of process stations 504, 506, 508, 510. Thus, the process stations 504, 506, 508, 510 are disposed adjacent to the central region 514 and are positioned in proximity to the robot 512.

In one implementation, the robot 512 has an arm with a single end effector sized to carry substrates between various modules 402, 404 and process stations 504, 506, 508, 510. In another implementation, the robot 512 has two arms, each arm having an end effector, for carrying the substrates. In this implementation, a first end effector may be utilized to retrieve substrates from the factory interface 402 and deliver the substrates to a process chamber 100 of one of the process stations 504, 506, 508, 510. A second end effector is utilized to transfer the substrate processed in the process chamber 100 to the post process chamber 300 of the same process station. The second effector may be utilized to cool substrates retrieved from the process chamber 100. In this implementation, the second end effector may be cooled, for example, by a fluid, and the surface area of the second end effector may be sufficiently large to contact the substrates to improve the rate of substrate cooling during substrate transfer. Subsequently, the first end effector may be utilized to transfer the substrate from the post process chamber 300 back to the factory interface 402. Advantageously, it is contemplated that utilizing a robot with different end effectors designed for certain transfer operations may reduce the probability of substrate contamination between different process operations and improve throughput.

The robot 512 moves linearly in the X direction to retrieve substrates from the factory interface 402 and to deliver the substrates to various process stations 504, 506, 508, 510 within the process module 404. The robot 512 also moves in the Y and Z directions to deliver and retrieve substrates from the chambers 100, 300 of the process stations 504, 506, 508, 510.

In an operational implementation, a substrate is delivered to a process chamber 100 of one of the process stations 504, 506, 508, 510 and iFGPEB processing is performed for an amount of time between about 30 seconds and about 90 seconds, for example, about 60 seconds. During processing of the substrate, the robot 512 may transfer other substrates between chambers 100, 300 of the process stations 504, 506, 508, 510 or to and from the factory interface 402. After the substrate has been iFGPEB processed in the process chamber 100, the robot 512 transfers the substrate to the post process chamber 300 of the same process station having the process chamber 100 which iFGPEB processed the substrate. The post process operation, which includes a cool down and development process, may be performed for an amount of time between about 15 seconds and about 90 seconds, such as about 30 seconds. After post processing, the substrate may be optionally cleaned and then delivered back to the factory interface 402.

Figure 6:
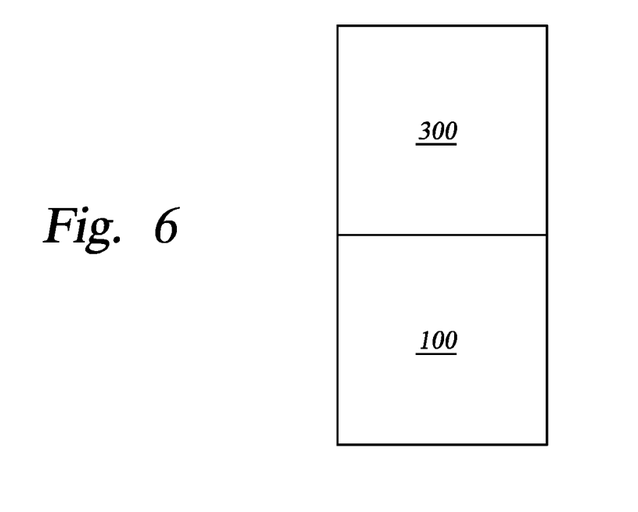
FIG. 6 is a schematic, side view of a process chamber and a post-process chamber arrangement in the process platform of FIG. 4 according to implementations described herein.

FIG. 6 is a schematic, side view of a process chamber 100 and a post-process chamber 300 arrangement in the process platform of FIG. 4 according to implementations described herein. More specifically, FIG. 6 illustrates the arrangement of the process chamber 100 and post process chamber 300 in a single process station. In the illustrated implementation, the post process chamber 300 is disposed above the process chamber 100. In other words, the post process chamber 300 is stacked on the process chamber 100. The chambers 300, 100 are also positioned such that openings of the chambers 300, 100 face the central region 514 and the robot 512 to allow for ingress and egress of substrates.

Figure 7:
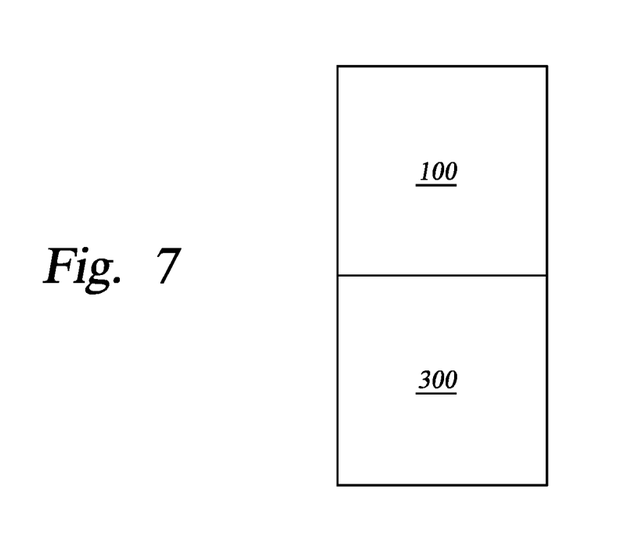
FIG. 7 is a schematic, side view of a process chamber and a post-process chamber arrangement in the process platform of FIG. 4 according to implementations described herein.

FIG. 7 is a schematic, side view of a process chamber 100 and a post-process chamber 300 arrangement within the process platform of FIG. 4 according to implementations described herein. More specifically, FIG. 7 illustrates the arrangement of the process chamber 100 and post process chamber 300 in a single process station. In the illustrated implementation, the process chamber is disposed above the post process chamber 300. In other words, the process chamber 100 is stacked on the post process chamber 300. Similar to the implementation described with regard to FIG. 6, the chambers 100, 300 are positioned such that openings of the chambers 100, 300 face the central region 514 and the robot to allow for ingress and egress of substrates.

By positioning the process chambers 100 and post process chamber 300 in a stacked arrangement in each of the process stations 504, 506, 508, 510, transfer time of substrates between the chambers 100, 300 by the robot is reduced an improved throughput may be realized. While the above implementations have contemplated that a substrate is processed in one of the process stations 504, 506, 508, 510, it is contemplated that a substrate may be processed in a process chamber 100 of a first process station and a post process chamber 300 of a second process station different from the first process station.

Figure 8:
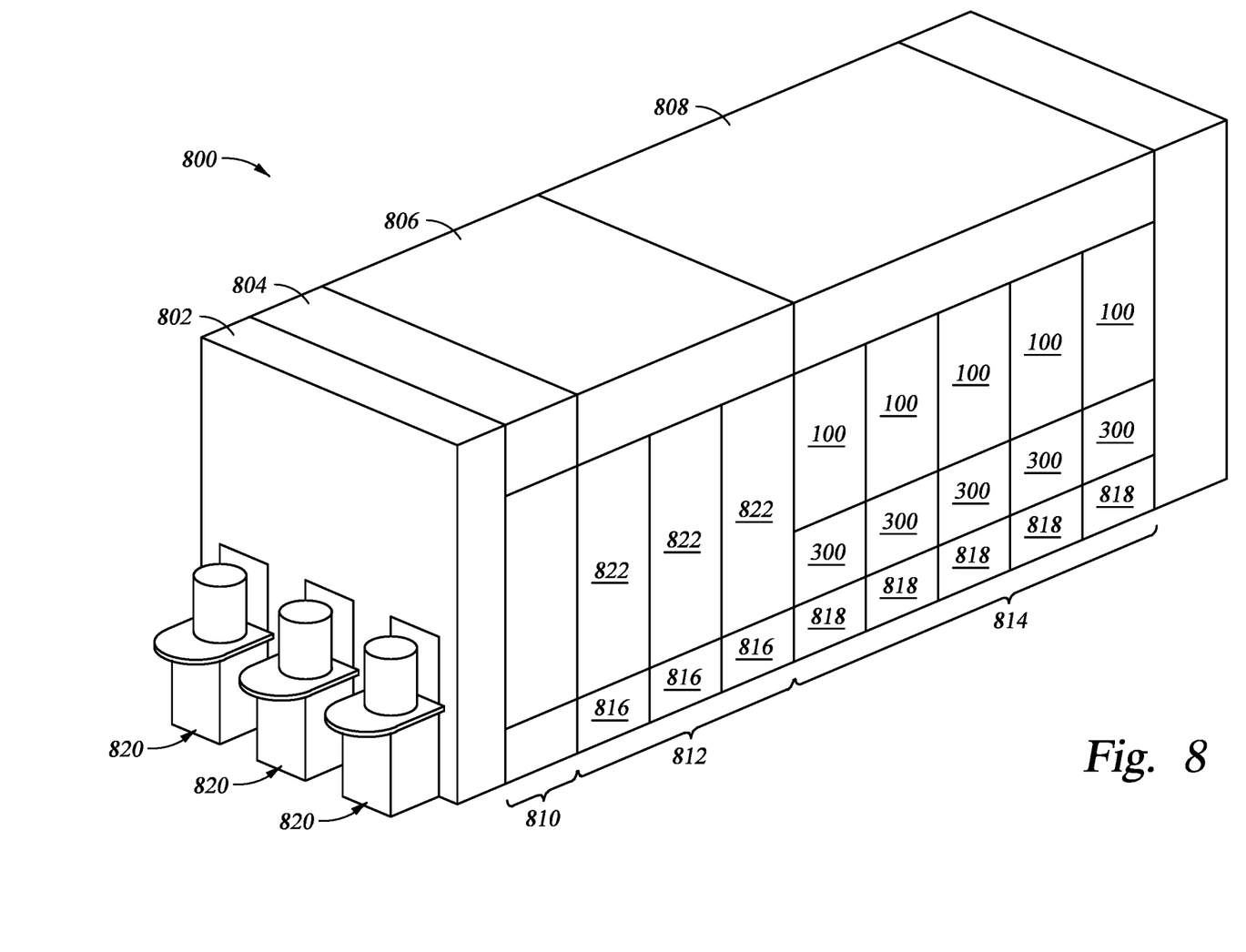
FIG. 8 illustrates a perspective view of a process platform according to implementations described herein.

FIG. 8 illustrates a perspective view of a process platform 800 according to implementations described herein. One example of the process platform 800 is the RAIDER® platform, available from Applied Materials, Inc., Santa Clara, Calif. It is contemplated that other suitably configured platforms from other manufacturers may also be utilized in accordance with the implementations described herein.

The process platform 800 includes a factory interface 802, an intermediate module 804, a support module 806, and a process module 808. The factory interface 802 is coupled to the intermediate module 804, which is coupled to the support module 806, which is coupled to the process module 808. The factory interface 402 includes a plurality of front opening unified pods (FOUPs) 820, such as three FOUPs 820. However, it is contemplated that the factory interface 802 may utilize a greater or lesser number of FOUPs 820, depending upon the throughput capability of the process module 808.

The process module 808 includes a plurality of process stations 814. The process stations 814 may be similar to the process stations 504, 506, 508, 510 in that each process station 814 contains a stacked process chamber 100 and post process chamber 300. While the illustrated implementation shows that the process chambers 100 are disposed on top of the post process chamber 30 (See FIG. 7), it is contemplated, similar to FIG. 6, that the post process chamber 300 may be disposed on top of the process chambers 100. Accordingly, it is contemplated that the process module 808 is implemented with corresponding numbers of process chambers 100 and post process chambers 300.

In one example, the process module 808 includes five process chambers 100 and five post process chambers 300 disposed on opposite sides of a centrally disposed robot track (not shown) for a total of ten process chambers 100 and ten post process chambers 300. While five process stations 814 are illustrated, it is contemplated that four (eight total) or six (twelve total) process stations 814 may also be advantageously utilized. A plurality of plumbing modules 818 are also provided in the process module 808. In this implementation, each process station 814 has a dedicated plumbing module 818. A robot (not shown) similar to the robot 512 may also be disposed in the process module 808 and operate to transfer substrates between the chambers 100, 300 of the process stations 814 and between the process module 808 and the support module 806.

The support module 806 includes a plurality of cleaning chambers 822. The cleaning chambers 822 are configured to rinse and spin dry substrates that have been iFGPEB processed in the process stations 814 of the process module 808. It is contemplated that the cleaning chambers 822 may be configured to rinse both a device side and a backside of the substrate either sequentially or simultaneously. The cleaning chambers 822 may also clean substrates prior to processing in the process module 808. A plurality of plumbing modules 816 are also provided in the support module 806. In this implementation, each clean station 812 having a cleaning chamber 822 has a dedicated plumbing module 812. Accordingly, the plumbing module 816 is configured to support cleaning of substrates with a complement of apparatus configured to enable cleaning operations. In certain implementations, the support module 806 may also have a robot (not shown) which transfers substrates between the clean stations 812 and the process module 808 or the intermediate module 804. Alternatively, process module robot may move between the process module 808 and the support module 806 to enable substrate transfer.

The intermediate module 804 includes one or more buffer stations 810 to improve the efficiency of substrate transfer between the factory interface 802 and the support module 806. The buffer station 810 may be utilized to compensate for process time disparities between process operations performed in the support module 806 and the process module 808. The buffer stations 810 may also be temperature controlled to modulate substrate temperature prior to processing in the support module 806 or delivery back to the factory interface 802.

In summation, implementations described herein provide for improved platforms for performing iFGPEB and associated process operations. Utilizing process stations having stacked process and post process chambers enables more efficient substrate transfer and increased throughput. In addition, various plumbing module configurations provide for improved process parameter modulation and maintenance operations. Accordingly, iFGPEB processing operations may be advantageously implemented on the apparatus describe herein.

While the foregoing is directed to implementations of the present disclosure, other and further implementations of the disclosure may be devised without departing from the basic scope thereof, and the scope thereof is determined by the claims that follow.

What is claimed is:

1. A platform apparatus, comprising:
a plumbing module; and
a process module comprising:
a central region having a robot disposed therein; and
a plurality of process stations disposed about the central region and sharing the plumbing module, wherein each process station includes a process chamber and a post process chamber in a stacked arrangement, the process chamber further comprising:
a chamber body defining a process volume;
a door coupled to the chamber body;
a first electrode coupled to the door; and
a power source communicatively coupled to the first electrode.

2. The platform apparatus of claim 1, wherein a major axis of the process volume is oriented vertically and a minor axis of the process volume is oriented horizontally.

3. The platform apparatus of claim 1, wherein the power source is configured to provide power ranging between about 1 V and about 20 kV to the first electrode.

4. The platform apparatus of claim 3, wherein the power source is configured to provide power with a frequency between about 0.1 Hz and about 1 MHz to the first electrode.

5. The platform apparatus of claim 4, wherein the power source is configured to generate an electric field ranging between about 1 kV/m and about 2 MV/m within the process volume.

6. The platform apparatus of claim 4, wherein the power source is configured to operate in a voltage-controlled mode.

7. The platform apparatus of claim 4, wherein the power source is configured to operate in a current-controlled mode.

8. The platform apparatus of claim 4, wherein the power source is configured to generate AC, DC, and pulsed DC waveforms.

9. The platform apparatus of claim 8, wherein the power source is configured to generate AC and pulsed DC power having a duty cycle between about 5% and about 95%.

10. The platform apparatus of claim 9, wherein the power source is configured to generate AC and pulsed DC power having a rise and fall time between about 1 ns and about 1000 ns.

11. The platform apparatus of claim 1, wherein the process chamber further comprises:
   a second electrode coupled to the chamber body, the second electrode disposed opposite the first electrode;
   a first plurality of fluid ports formed in a sidewall of the chamber body adjacent the process volume; and
   a second plurality of fluid ports formed in the sidewall of the chamber body adjacent the process volume opposite the first plurality of fluid ports.

12. A platform apparatus, comprising:
   a factory interface;
   a plumbing module; and
   a process module coupled to the factory interface and the plumbing module, the process module comprising:
      a central region having a robot disposed therein; and
      a plurality of process stations disposed about the central region and sharing the plumbing module, wherein each process station includes a process chamber and a post process chamber in a stacked arrangement, the process chamber further comprising:
         a chamber body defining a process volume, wherein a major axis of the process volume is oriented vertically and a minor axis of the process volume is oriented horizontally;
         a door coupled to the chamber body;
         a first electrode coupled to the door;
         a plurality of fluid ports formed in a sidewall of the chamber body adjacent the process volume; and
         a power source communicatively coupled to the first electrode.

13. The platform apparatus of claim 12, wherein the power source is configured to provide a power ranging between about 1 V and about 20 kV to the first electrode.

14. The platform apparatus of claim 12, wherein the power source is configured to provide a power with a frequency between about 0.1 Hz and about 1 MHz to the first electrode.

15. The platform apparatus of claim 12, wherein the power source is configured to generate an electric field ranging between about 1 kV/m and about 2 MV/m within the process volume.

16. The platform apparatus of claim 12, wherein the power source is configured to operate in a voltage-controlled mode.

17. The platform apparatus of claim 12, wherein the power source is configured to operate in a current-controlled mode.

18. The platform apparatus of claim 12, wherein the power source is configured to generate AC, DC, and pulsed DC waveforms to the first electrode.

19. The platform apparatus of claim 18, wherein the power source is configured to generate AC and pulsed DC power having a duty cycle between about 20% and about 60%.

* * * * *